United States Patent
Saric (10) Patent No.: US 10,284,209 B2
(45) Date of Patent: May 7, 2019

(54) PHASE LOCKED LOOP

(71) Applicant: NXP B.V., Eindhoven (NL)

(72) Inventor: Tarik Saric, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 15/987,670

(22) Filed: May 23, 2018

(65) Prior Publication Data

US 2019/0013815 A1    Jan. 10, 2019

(30) Foreign Application Priority Data

Jul. 7, 2017   (EP) .................................... 17180320

(51) Int. Cl.
| | | |
|---|---|---|
| *H03L 7/093* | (2006.01) | |
| *H03L 7/099* | (2006.01) | |
| *G01S 7/35* | (2006.01) | |
| *H03L 7/095* | (2006.01) | |

(52) U.S. Cl.
CPC ................ *H03L 7/093* (2013.01); *G01S 7/35* (2013.01); *H03L 7/095* (2013.01); *H03L 7/099* (2013.01)

(58) Field of Classification Search
CPC . G01S 7/35; H03L 7/093; H03L 7/095; H03L 7/099
USPC ......................................... 327/142, 147, 156
See application file for complete search history.

(56) References Cited

U.S. PATENT DOCUMENTS

| | | |
|---|---|---|
| 2010/0150209 A1 | 6/2010 | Gonzalez et al. |
| 2012/0062297 A1 | 3/2012 | Keaveney et al. |
| 2014/0118037 A1* | 5/2014 | Chen ....................... H03L 7/185 327/145 |

(Continued)

FOREIGN PATENT DOCUMENTS

EP    2818887 A1    12/2014

OTHER PUBLICATIONS

Yu et al., "A 0.65-V 2.5-GHz Fractional-N Synthesizer With Two-Point 2-Mb/s GFSK Data Modulation," IEEE Journal of Solid-State Circuits, vol. 44, No. 9, Sep. 2009, 15 pages.

(Continued)

*Primary Examiner* — William Hernandez (57) ABSTRACT

A phase locked loop for generating a frequency chirp is disclosed. The phase locked loop comprises a phase frequency detector configured to receive a reference frequency signal at a first input, a low pass filter configured to receive a current from the phase frequency detector at a filter input, and to output a control voltage, a voltage controlled oscillator configured to generate the frequency chirp at an output in response to receiving the control voltage, a feedback path connecting the output of the voltage controlled oscillator to a second input of the phase frequency detector, the feedback path comprising a frequency divider; and a timing module configured to generate a reset pulse. The low pass filter comprises a plurality of capacitors connected in parallel between the filter input and a common voltage line; and a voltage source configured to generate an initial control voltage. The voltage source is switchably connected to a node between a first capacitor of the plurality of capacitors and the common voltage line, and is connected to the node during a chirp reset mode defined by the reset pulse such that (Continued)

the voltage at the node is substantially equalized to the initial control voltage.

14 Claims, 5 Drawing Sheets

(56) References Cited

U.S. PATENT DOCUMENTS

| | | | |
|---|---|---|---|
| 2015/0002328 A1* | 1/2015 | Vaucher | G01S 7/02 |
| | | | 342/88 |
| 2015/0219753 A1 | 8/2015 | Salle et al. | |
| 2017/0023670 A1* | 1/2017 | Jansen | G01S 7/354 |
| 2018/0191302 A1* | 7/2018 | Saric | H03C 3/0925 |
| 2018/0191364 A1* | 7/2018 | Pavlovic | H03K 3/0231 |

OTHER PUBLICATIONS

Peng et al., "Design and Optimization of a 2.4 GHz CMOS Two-Point VCO for Direct GFSK Modulation," http://140.117.166.1/eehome/ISCOM2005/SubmitPaper/UploadPapers/ISCON05_00134.pdf downloaded May 8, 2018, 4 pages.

* cited by examiner

PHASE LOCKED LOOP

CROSS-REFERENCE TO RELATED APPLICATIONS

This application claims priority under 35 U.S.C. § 119 to European patent application no. EP17180320.8, filed Jul. 7, 2017, the contents of which are incorporated by reference herein.

FIELD

The disclosure relates to a phase locked loop, particularly to a phase locked loop for generating a frequency chirp.

BACKGROUND

Frequency modulated continuous wave (FCMW) radar can be used to determine the range to a target. In contrast to other radar systems, such as pulsed radar, FCMW radar systems radiate continuous transmission power. The frequency of the transmitted radar beam is changed with time, in a frequency chirp. The bandwidth of the chirp, i.e. the difference between the lowest and highest transmitted frequencies, determines the resolution of the radar system. Systems with larger bandwidths have higher resolutions than those with smaller bandwidths. Thus to detect nearby targets, a large bandwidth is needed, for example 1 GHz or 4 GHz for automotive radar systems.

A frequency chirp has a defined rise and fall time, often called acquisition time and reset time respectively. All the important information for determining range is measured during the acquisition time. The reset time is the time needed to reset the chirp from its final frequency to its initial frequency. It is desirable that the reset time be as short as possible, to maximise useful acquisition time, leading to a better dynamic range of the radar system and lower power consumption (due to shorter data post-processing times). Thus the rate of change of frequency is typically much higher in the reset time than in the acquisition time.

The frequency chirps for FCMW radar systems are typically generated by a phase locked loop (PLL). For such closed loops, faster reset times require higher PLL bandwidths. However, higher PLL bandwidths also result in higher phase noise, which is not desirable for radar systems. This problem is further compounded by large chirp bandwidths, which increase the rate at which the frequency must be reset due to the larger difference between the initial and final frequencies.

SUMMARY

According to a first aspect of the disclosure, there is provided a phase locked loop for generating a frequency chirp, the phase locked loop comprising:
a phase frequency detector configured to receive a reference frequency signal at a first input;
a low pass filter configured to receive a current from the phase frequency detector at a filter input, and to output a control voltage;
a voltage controlled oscillator configured to generate the frequency chirp at an output in response to receiving the control voltage;
a feedback path connecting the output of the voltage controlled oscillator to a second input of the phase frequency detector, the feedback path comprising a frequency divider; and a timing module configured to generate a reset pulse;
wherein the low pass filter comprises:
a plurality of capacitors connected in parallel between the filter input and a common voltage line; and
a voltage source configured to generate an initial control voltage, wherein the voltage source is switchably connected to a node between a first capacitor of the plurality of capacitors and the common voltage line, wherein the voltage source is connected between the first capacitor and the common voltage line during a chirp reset mode defined by the reset pulse such that the voltage at the node is substantially equalised to the initial control voltage.

Substantially equalising the voltage at the node with the initial control voltage may comprise increase or decreasing the voltage at the node until that voltage is within 5% or 1% or 0.5% of the initial control voltage.

The chirp reset mode may have the same duration as the reset pulse, or may be initialised by the reset pulse and have a pre-determined duration. the common voltage line may for example be ground, or a high voltage rail.

The phase locked loop operates as a conventional PLL during a chirp acquisition phase. In the reset phase, however, defined by the reset pulse, the voltage source is connected between the first capacitor and the common voltage line. This quickly drains current from, or injects current into, the first capacitor, quickly pulling the control voltage to the initial control voltage, which in turn draws the frequency of the signal generated by the voltage controlled oscillator (VCO) to an initial frequency, thus resetting the chirp. In this way, a short reset time is possible without requiring a high PLL bandwidth, avoiding the phase noise problems associated with a high PLL bandwidth.

In some embodiments, the voltage source may act as a current sink, drawing current from the node. In such embodiments, the voltage at the node is reduced to a low initial value, enabling reset of chirps that start at a low frequency and finish at a higher frequency.

In some embodiments the voltage source may act as a current source, injecting current into the node. In such embodiments, the voltage at the node is increased to a high initial value, enabling reset of chirps that start at a high frequency and finish at a lower frequency.

In some embodiments the voltage source may comprise a digital to analogue convertor (DAC) configured to output a fixed voltage. By connecting the DAC between the first capacitor and the common voltage line, the DAC draws current from the capacitor (or injects current when acting as a current source), leading to a voltage at the low pass filter output that substantially matches the initial control voltage.

The initial control voltage may control the VCO to set an initial frequency of the frequency chirp. In some embodiments, the digital to analogue convertor may be further switchably connected to an output of the low pass filter to provide an initial control voltage to the voltage controlled oscillator.

In some embodiments, the voltage source may further comprise a unity gain amplifier, such as an op-amp with negative feedback. The unity gain amplifier may be particularly be used where the slew rate of the DAC is not sufficient to discharge the first capacitor.

In some embodiments, the capacitance of the first capacitor may be larger than the capacitance of any other capacitor of the plurality of capacitors.

In some embodiments, the phase locked loop may comprise a switch configured to switch the voltage source into connection with the node between the first capacitor and the common voltage line in response to receiving the reset pulse. For example, the switch may be connected between the first capacitor and the unity gain amplifier.

In some embodiments, the phase locked loop may further comprise a lock detector connected between the first input of the phase frequency detector and the second input of the phase frequency detector (i.e. the output of the divider), the lock detector configured identify a cycle slip during the chirp reset mode. The lock detector may be configured to adjust the PLL in response to detecting a cycleslip to limit or prevent further cycle slips. For example the lock detector may be configured to adjust a duration of the chirp reset mode, for example by increasing the duration of the reset pulses.

According to a second aspect of the disclosure, there is provided a radar system, the radar system comprising a phase-locked loop in accordance with any embodiment of the first aspect. The radar system may be a radar system for a vehicle.

According to a third aspect of the disclosure there is provided a method of generating a chirp in a phase locked loop, the method comprising:

generating an output signal at an output of a voltage controlled oscillator of the phase locked loop;

entering a frequency sweeping mode in which the frequency of the output signal is swept from an initial frequency to a final frequency by sweeping a control voltage applied to the voltage controlled oscillator from an initial control voltage to a final control voltage by sweeping a division ratio of a frequency divider in a feedback path of the phase locked loop;

entering a chirp reset mode in which the control voltage is reset to the initial control voltage by switching a voltage source into connection between a first capacitor of the low pass filter and a common voltage line, such that the voltage at the node is substantially equalised to an initial control voltage generated by the voltage source; and re-entering the frequency sweeping mode.

In some embodiments the duration of the chirp reset mode may be less than 50%, or less than 20%, or less than 10% of the duration of the frequency sweeping mode, thus increasing the total time available for the acquisition mode.

In some embodiments, switching a voltage source into connection may comprise sinking current from the node across the voltage source, or applying current from the voltage source to the node.

In some embodiments the method may further comprise initialising the control voltage by connecting the fixed voltage source to an output of the low pass filter.

In some embodiments, the phase locked loop may comprise a lock detector connected between an input of a phase frequency detector of the phase locked loop and the output of the frequency divider. The method may further comprise identifying, with the lock detector, a cycle slip during the chirp reset mode; and in response to identifying a cycle slip, adjusting the duration of the chirp reset mode.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

Figure 1:
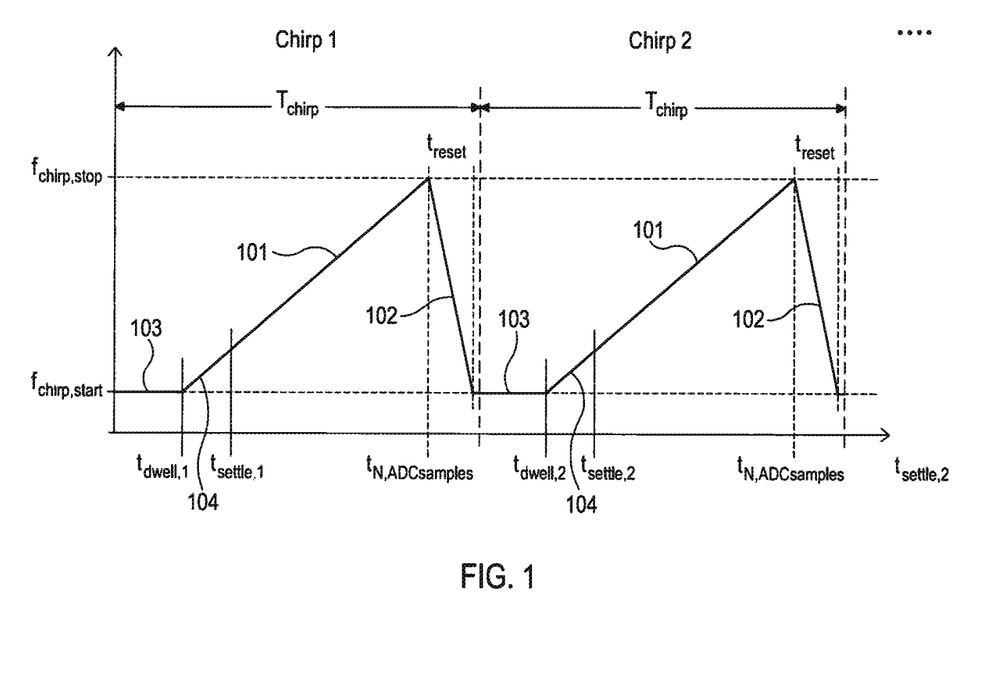
FIG. 1 shows a conventional sequence of frequency chirps.

FIG. 1 shows a typical FCMW signal from a conventional FCMW radar system. The signal comprises a plurality of frequency chirps (only two are shown in the figure), each with total duration $T_{chirp}$. In each chirp the frequency is swept from an initial frequency ($f_{chirp,\ start}$) to a final frequency ($f_{chirp,\ stop}$). Range information is acquired from the acquisition time 101 of each chirp. The chirps are reset during reset times 102. As shown in FIG. 1, a chirp may also comprise a dwell time 103 and a settle time 104.

The rate of change of frequency during the reset times 102 is much higher than in the acquisition times 103, to minimise time lost to resets. Thus the reset times 102 are the most demanding in terms of speed and rate of change for the phase locked loop (PLL) generating the chirps. Thus the reset times 102 and rate of frequency change in the reset times 102 determine the bandwidth requirement of the PLL: the shorter the reset time, the higher the bandwidth needed to avoid cycle slip. Higher PLL bandwidths lead to higher phase noise.

Figure 2:
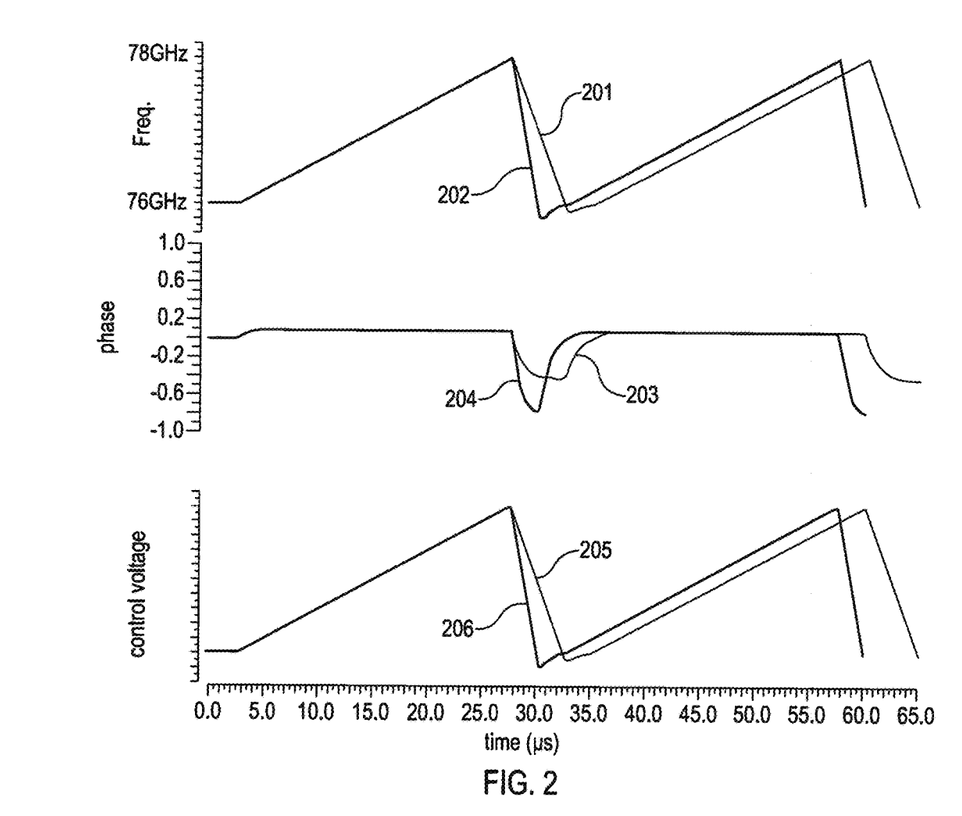
FIG. 2 shows the increase of phase difference in a conventional PLL when the reset time is reduced.

FIG. 2 illustrates this problem, showing the chirps, phase difference between phase frequency detector (PFD) inputs, and VCO control voltage for a conventional PLL for reset times of 5 μs (lines 201, 203, 205 respectively) and 2.5 μs (lines 202, 204, 206 respectively), with fixed PLL bandwidth. As can be seen in FIG. 2, reducing the reset time leads to a large increase in the phase difference between the PFD inputs, reaching the dynamic range of the PFD and causing cycle slip.

Figure 3:
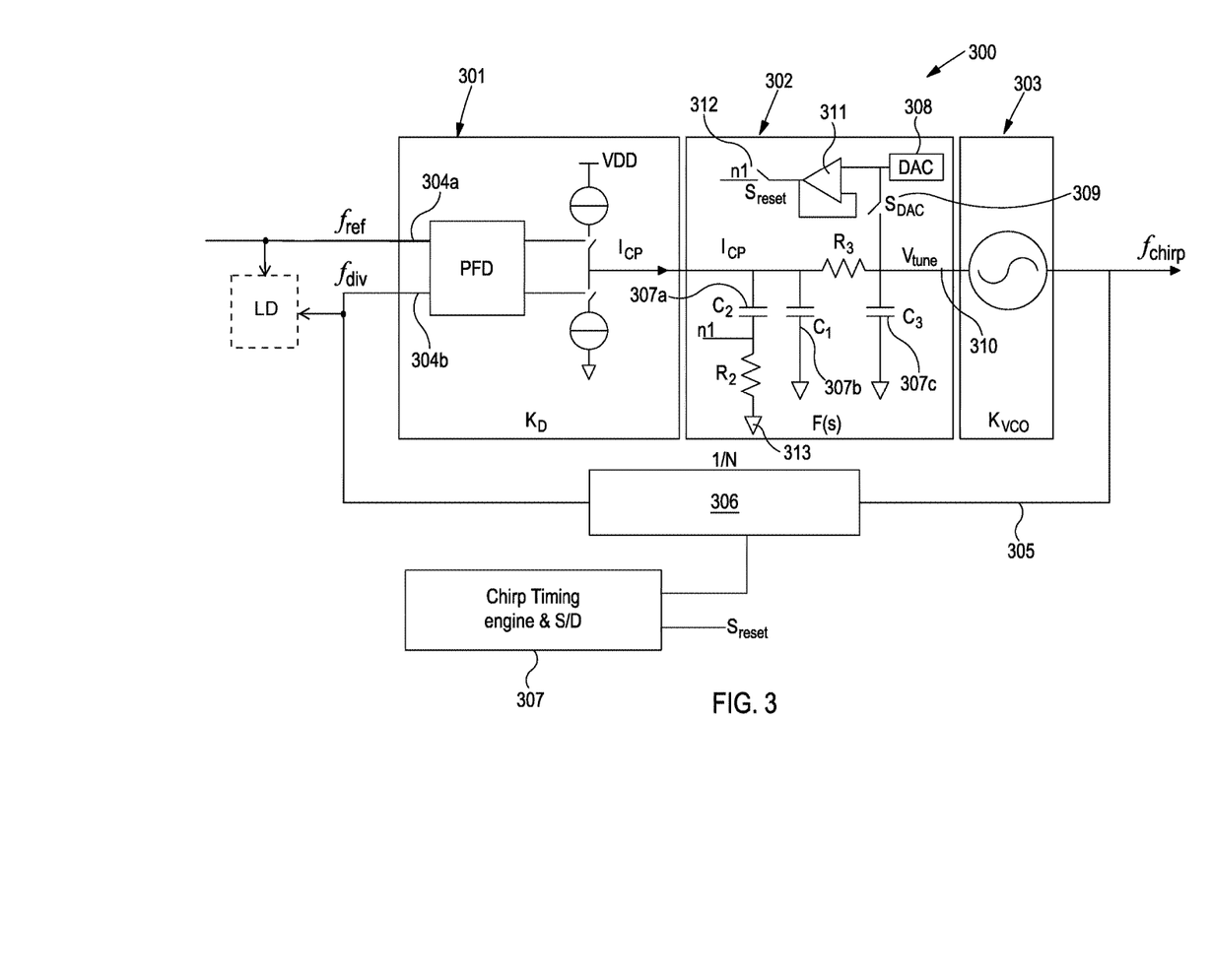
FIG. 3 shows a schematic representation of a PLL according to the present disclosure.

FIG. 3 shows a phased locked loop 300 that may overcome the problems of conventional PLLs. As in a conventional PLL, PLL 300 comprises a phase frequency detector and charge pump (PFD-CP) 301, a low-pass filter (LPF) 302, and a voltage controlled oscillator (VCO) 303. The PFD 301 receives a reference signal and a feedback signal at inputs 304a, 304b respectively. The feedback signal is the output signal from the VCO 303, fed back by a feedback loop 305 via a multi-modulus divider 306. The divider 306 divides the frequency of the VCO output signal by a division ratio, N, based on a clock signal from timing device 307. As n is swept, the frequency of the signal provided at the second input of the phase detector is changed, resulting in a change in the control voltage generated by the LPF 302 and thus providing for the shifting frequency of the chirp.

The PFD-CP 301 generates a current based on the phase difference between the inputs 401a, 401b. The current is fed into the LPF 302, which in turn generates a control voltage ($V_{tune}$) for controlling the VCO 303. The VCO 303 outputs a signal with a frequency dependent upon the control voltage. Thus a frequency chirp is generated by the changing control voltage, which is itself controlled by frequency division introduced by the divider 306.

The LPF 302 comprises a plurality of capacitors 307a-c. Capacitor 307a has a capacitance much larger than capacitors 307b and 307c, for example capacitor 307a may have a capacitance between 0.5 and 5 nF, or between 1 and 2 nF.

The LPF 302 further comprises a digital to analogue convertor (DAC) 308, configured to generate an initial control voltage. The initial control voltage may for example be between 100 mV and 500 mV, or between 140 mV and 160 mV. The DAC 308 is connected via a switch 309 to the output 310 of the LPF 302. Before a chirp sequence, switch 309 is closed so that the initial control voltage from DAC 308 is output from the LPF 302, and used to control the VCO 303 to set an initial frequency. A coarse capacitance bank of the VCO 303 may be adjusted to ensure the frequency output by the VCO 303 is at the desired initial frequency. During this initialisation process, the charge pump of PFD-CP 301 is turned off. Thereafter, the frequency chirps are defined and controlled by the timing module 307, as described above.

The DAC 308 is also connected to a unity gain amplifier 311, which is in turn connected via a switch 312 to node $n_1$ between the capacitor 307a and a common voltage line (e.g. ground) 313. The DAC 308 and the unity gain amplifier together comprise the voltage source.

During the acquisition mode, the switch 312 is open, disconnecting the unity gain amplifier 311 and DAC 308 from the capacitor bank of the LPF 302. The PLL 300 operates as a conventional PLL, generating a frequency chirp. In the reset mode, however, the switch 312 is closed. The unity gain amplifier 311 holds its output voltage to the DAC 308 voltage (the initial control voltage), even when the switch 312 is closed. The unity gain amplifier will correct the voltage difference between its fixed output voltage and the node $n_1$ by drawing current from the capacitor 307a. The unity gain amplifier 311, in combination with the DAC 308, thus acts as a current sink to quickly sink the current at node $n_1$. The speed at which this current sinking occurs depends on the bandwidth and slew rate of the unity gain amplifier 311.

The node $n_1$ rapidly discharges through the unity gain amplifier until the voltage across the capacitor 307a matches the initial control voltage generated by DAC 308. Thus the voltage at the output 310 of the LPF 302 is quickly drawn back to approximately the initial control voltage, in turn quickly resetting the frequency of the VCO 303 to the approximately the initial frequency, thus resetting the chirp.

In effect, this is two-point modulation used only during the reset phase of the PLL 300. The chirp reset can happen quickly, without needing an increased bandwidth of the PLL. The reset time may be reduced to between 0.5 and 2 µs, for example.

The reset time may be controlled by the timing module 307, which generates a reset pulse $S_{reset}$. The switch 312 closes in response to receiving the reset pulse, and stays closed for as long as the pulse lasts. In this way, the timing for the reset and the timing of the divider 306 are aligned, minimising the phase difference between the inputs 304a, 304b of the PFD-CP 301, and so minimising the likelihood of a cycle slip occurring.

Figure 4:
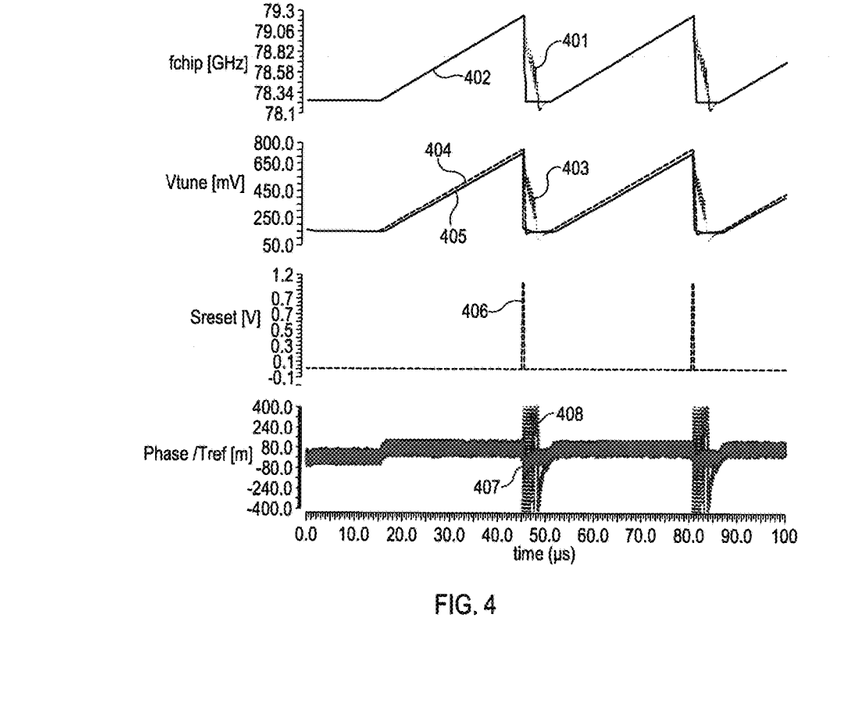
FIG. 4 shows a comparison of the performance of the PLL of FIG. 3 to that of a conventional PLL.

FIG. 4 shows a comparison of the frequency, control voltage and phase difference of PFD inputs for a conventional PLL (lines 401, 403, and 407 respectively) and for the PLL 300 (lines 402, 404, and 408 respectively). Also shown is the frequency sweep for an ideal chirp (overlapping with line 401), the voltage at node $n_1$ (line 405), and the reset pulse 406, which defines the reset phase. The PLL bandwidth of both PLLs in FIG. 4 is 525 kHz.

As can be seen in FIG. 4, the output frequency (line 402) of the PLL 300 is reset to its initial value much faster than for the conventional PLL (line 401), but without inducing a large amount of phase noise (line 408 compared to line 407).

The PLL 300 effectively decouples the reset time from the bandwidth of the PLL. Thus the PLL bandwidth can be reduced, to optimise it for the acquisition time and rate of frequency change in the acquisition period.

Figure 5:
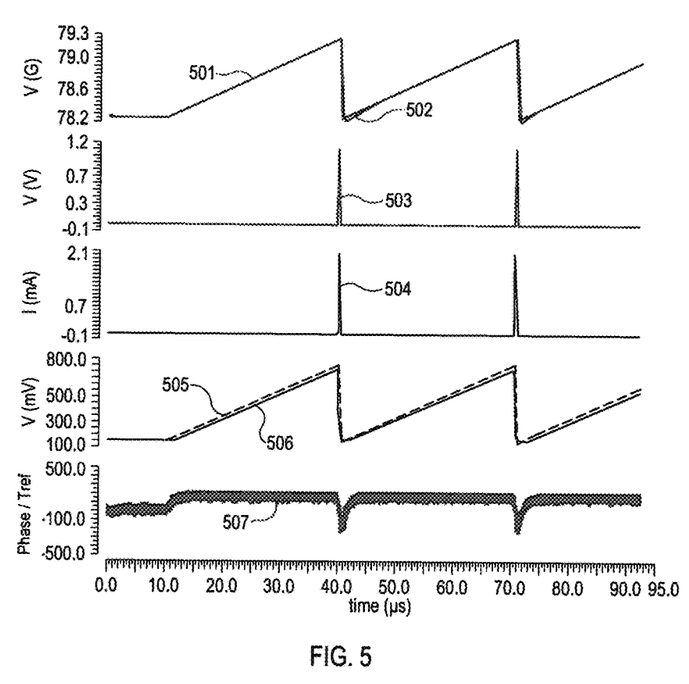
FIG. 5 shows the performance of a PLL according to the present disclosure with a reduced PLL bandwidth.

FIG. 5 shows a simulation of a PLL 300 with a reduced bandwidth of 350 kHz. Lines 501 and 502 show a comparison of the VCO control voltage for an ideal chirp to the control voltage generated by the example PLL 300. The two lines substantially overlap, showing that the PLL operates with close to ideal behaviour, even despite the reduced PLL bandwidth.

Line 503 indicates the positions of reset pulses. At the point the reset mode is enabled, the control voltage is high (~800 mV), so the unity gain amplifier 311 will experience a large voltage difference compared to the DAC output (155 mV), and will respond by drawing a large current. Line 504 represents the current drawn by the unity gain amplifier 311 from node $n_1$. The corresponding falls in the voltage at $n_1$ and the control voltage are shown in lines 505 and 506 respectively.

The phase between the inputs 304a, 304b of the PFD is shown by line 507. The phase jumps to 0.25 during the chirp reset, showing that there is some deviation from ideal PLL behaviour. This deviation is to be expected, as the unity gain amplifier acts like feedforward compensation. However, this phase difference is still below the level at which a cycle slip would occur (a phase difference of 0.5).

To further limit the possibility of cycle slip, a lock detector (labeled as LD) may be used (as indicated by the broken outline), connected between the first (304a) and second (304b) inputs of the phase detector 301, with a window set around the rising edges of the two input signals. The lock detector may monitor the phase difference during chirp resets, and set limits on maximum allowable phase differences. If the phase difference exceeds the maximum, the lock detector may adjust the PLL to reduce the phase difference. In particular, the lock detector may adjust the chirp reset time until the phase is in an allowable range. For example, the lock detector may adjust the reset time in the range 2µs to 0.5 µs, e.g. in steps of 0.5 µs, until an allowable phase difference during chirp reset is reached. Thus the lock detector may prevent cycle slip.

In the above examples, the DAC and unity gain amplifier were described as a current sink, drawing current from the node $n_1$ to reduce the VCO control voltage to an initial value. It is to be understood that the voltage source, comprising the DAC and unity gain amplifier, may alternatively act as a current source, injecting current into the node $n_1$ to increase the control voltage to an initial value, in cases where the frequency chirp sweeps from high frequency to low frequency. In some examples the voltage source may be switchable between acting as a current source and acting as a current sink, in order to reverse the direction of the chirp.

From reading the present disclosure, other variations and modifications will be apparent to the skilled person. Such variations and modifications may involve equivalent and other features which are already known in the art of phase locked loops, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality and reference signs in the claims shall not be construed as limiting the scope of the claims.

The invention claimed is:

1. A phase locked loop for generating a frequency chirp, the phase locked loop comprising:
   a phase frequency detector configured to receive a reference frequency signal at a first input;
   a low pass filter configured to receive a current from the phase frequency detector at a filter input, and to output a control voltage;
   a voltage controlled oscillator configured to generate the frequency chirp at an output in response to receiving the control voltage;
   a feedback path connecting the output of the voltage controlled oscillator to a second input of the phase frequency detector, the feedback path comprising a frequency divider; and
   a timing module configured to generate a reset pulse;
   wherein the low pass filter comprises:
      a plurality of capacitors connected in parallel between the filter input and a common voltage line; and
      a voltage source configured to generate an initial control voltage, wherein the voltage source is switchably connected to a node between a first capacitor of the plurality of capacitors and the common voltage line, wherein the voltage source is connected to the node during a chirp reset mode defined by the reset pulse such that the voltage at the node is substantially equalised to the initial control voltage.

2. The phase locked loop of claim 1, wherein the voltage source acts as a current sink, or wherein the voltage source acts as a current source.

3. The phase locked loop of claim 1, wherein the voltage source comprises a digital to analogue convertor.

4. The phase locked loop of claim 3, wherein the digital to analogue convertor is further switchably connected to an output of the low pass filter to provide an initial control voltage to the voltage controlled oscillator.

5. The phase locked loop of claim 3, wherein the voltage source further comprises a unity gain amplifier.

6. The phase locked loop of claim 1, wherein the capacitance of the first capacitor is larger than the capacitance of any other capacitor of the plurality of capacitors.

7. The phase locked loop of claim 1, wherein the phase locked loop comprises a switch configured to switch the voltage source into connection with the node in response to receiving the reset pulse.

8. The phase locked loop of claim 1, further comprising a lock detector connected between the first input of the phase frequency detector and the second input of the phase frequency detector, the lock detector configured to identify a cycle slip during the chirp reset mode.

9. The phase locked loop of claim 8, wherein the lock detector is configured to adjust a duration of the chirp reset mode.

10. A method of generating a chirp in a phase locked loop, the method comprising:
   generating an output signal at an output of a voltage controlled oscillator of the phase locked loop;
   entering a frequency sweeping mode in which the frequency of the output signal is swept from an initial frequency to a final frequency by sweeping a control voltage applied to the voltage controlled oscillator from an initial control voltage to a final control voltage by sweeping a division ratio of a frequency divider in a feedback path of the phase locked loop;
   entering a chirp reset mode in which the control voltage is reset to the initial control voltage by switching a voltage source into connection with a node between a first capacitor of the low pass filter and a common voltage line, such that the voltage at the node is substantially equalised to an initial control voltage generated by the voltage source; and
   re-entering the frequency sweeping mode.

11. The method of claim 10, wherein the duration of the chirp reset mode is less than 50%, or less than 20%, or less than 10% of the duration of the frequency sweeping mode.

12. The method of claim 10, wherein switching the voltage source into connection comprises sinking current from the node across the voltage source, or applying current from the voltage source to the node.

13. The method of claim 10, further comprising initialising the control voltage by connecting the voltage source to an output of the low pass filter.

14. The method of claim 10, wherein the phase locked loop comprises a lock detector connected between an input of a phase frequency detector of the phase locked loop and the output of the voltage controlled oscillator; and
   wherein the method further comprises identifying, with the lock detector, a cycle slip during the chirp reset mode; and
   in response to identifying a cycle slip, adjusting the duration of the chirp reset mode.

* * * * *